「US008737943B2

(12) United States Patent
Chan et al.

(10) Patent No.: US 8,737,943 B2
(45) Date of Patent: ＊May 27, 2014

(54) SYSTEMS AND METHODS FOR RECEIVING AND TRANSFERRING VIDEO INFORMATION

(75) Inventors: Eric Chan, Singapore (SG); Sack Lee Chan, Singapore (SG); Hiroshi Suzuki, Irvine, CA (US); Prijesh Patel, Saratoga, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,214

(22) Filed: Sep. 13, 2012

(65) Prior Publication Data

US 2013/0002965 A1 Jan. 3, 2013

Related U.S. Application Data

(63) Continuation of application No. 12/133,564, filed on Jun. 5, 2008, now Pat. No. 8,270,920.

(51) Int. Cl.
*H04B 1/18* (2006.01)

(52) U.S. Cl.
USPC ............ 455/187.1; 455/526; 455/151.3; 375/240.01; 725/39

(58) Field of Classification Search
USPC ......... 455/187.1, 526, 151.3, 180.3, 191.1; 725/39, 11; 386/1, 46, 52; 375/240.01
See application file for complete search history.

(56) References Cited

U.S. PATENT DOCUMENTS

| | | | | |
|---|---|---|---|---|
| 5,315,448 A * | 5/1994 | Ryan | | 360/60 |
| 5,574,787 A * | 11/1996 | Ryan | | 380/201 |
| 6,008,802 A * | 12/1999 | Iki et al. | | 715/721 |
| 6,374,404 B1 * | 4/2002 | Brotz et al. | | 725/46 |
| 6,477,589 B1 * | 11/2002 | Suzuki et al. | | 710/18 |
| 6,516,132 B1 * | 2/2003 | Wrobleski et al. | | 386/254 |
| 6,865,336 B2 * | 3/2005 | Johnson | | 386/291 |
| 7,055,167 B1 * | 5/2006 | Masters | | 725/39 |
| 7,174,085 B2 * | 2/2007 | Demas et al. | | 386/350 |
| 7,450,852 B2 * | 11/2008 | Calhoon | | 398/106 |
| 7,533,402 B2 * | 5/2009 | Demas et al. | | 725/71 |
| 7,636,559 B2 * | 12/2009 | Magnusen et al. | | 455/266 |
| 7,664,369 B2 * | 2/2010 | Wrobleski et al. | | 386/305 |
| 7,669,056 B2 * | 2/2010 | Frank et al. | | 713/176 |
| 2002/0106018 A1 * | 8/2002 | D'Luna et al. | | 375/240.01 |
| 2002/0188772 A1 * | 12/2002 | Radcliffe et al. | | 710/38 |
| 2003/0035650 A1 * | 2/2003 | Demas et al. | | 386/112 |
| 2003/0049016 A1 * | 3/2003 | Wrobleski et al. | | 386/94 |
| 2003/0059200 A1 * | 3/2003 | Cuijpers et al. | | 386/46 |
| 2006/0041655 A1 * | 2/2006 | Holloway et al. | | 709/223 |
| 2007/0127891 A1 * | 6/2007 | Demas et al. | | 386/112 |
| 2009/0064266 A1 * | 3/2009 | Wollmershauser et al. | | 725/134 |
| 2010/0178032 A1 * | 7/2010 | Wrobleski et al. | | 386/94 |
| 2011/0265120 A1 * | 10/2011 | Vaysman et al. | | 725/39 |

* cited by examiner

*Primary Examiner* — Minh D Dao
(74) *Attorney, Agent, or Firm* — Brinks Gilson & Lione

(57) ABSTRACT

Devices and methods for receiving, processing and formatting digital video. The devices may include a single semiconductor chip on which is imprinted a radio frequency signal tuner module and a display interface module. The display interface module may be configured to receive programming information from the radio frequency signal tuner module. The display interface module may be configured to communicate the programming information to a digital video recorder. The radio frequency tuner module may include a first radio frequency input channel and a second radio frequency input channel. The radio frequency signal tuner module may include a system oscillator and a phase-locked loop ("PLL") circuit configured to generate a clock signal. The phase-locked loop circuit may be configured to transmit the signal to the display interface module and to any other suitable modules on the chip.

20 Claims, 11 Drawing Sheets

SYSTEMS AND METHODS FOR RECEIVING AND TRANSFERRING VIDEO INFORMATION

CROSS-REFERENCE TO RELATED APPLICATIONS

This application is a continuation of U.S. Ser. No. 12/133,565, filed Jun. 6, 2005, entitled "Systems and Methods for Receiving and Transferring Video Information," now U.S. Pat. No. 8,270,920.

FIELD OF TECHNOLOGY

The present invention relates generally to digital video information acquisition and transfer.

BACKGROUND OF THE INVENTION

Digital video broadcast ("DVB") data is transmitted and received at high rates to achieve the throughput required for satisfactory viewing. Standards for DVB data transmission have been available for over ten years. Standards for satellite network based DVB have more recently been developed. A recently formulated standard, promulgated by the European Telecommunications Standards Institute (Sophia Antipolis, France) is DVB-S2 (Standard No. EN 302307). DVB-S2 is expected to be widely backward-compatible at receivers with its predecessor, DVB-S, and support the use of Generic Stream, the DVB-S2 native stream format, HDTV, MPEG-2 TS, and H.264 (viz., MPEG-4 AVC) video codecs. DVB-S2 may support interactive Internet-based applications and services, in which data generated by the user may be sent by cable or satellite uplink; professional applications, in which data must is multiplexed and broadcast in the VHF/UHF band; content distribution; and trunking.

The standards provide inter-device compatibility and efficiencies that contribute to high throughput rates. DVB receivers, such as set-top boxes, are often designed in conformance with the standards and may require equipment and logic capabilities that also contribute to high throughput rates.

At high throughput rates, demodulation, decoding, demultiplexing and related operations often require numerous data processing modules. Manufacturing costs for systems that involve numerous data processing materials are high. Systems that require numerous data processing modules often include longer conductors that dissipate more electric energy than shorter conductors. Such systems require larger power sources and larger power conditioning components. Larger power sources and larger power conditioning components increase the cost of manufacturing. Larger and more numerous components in general reduce the versatility of high throughput rate systems, because overall system dimensions are often limited. When system dimensions are limited, larger and more numerous components can be included only at the expense of other components and their associated functionality and features.

It therefore would be desirable to provide systems for processing digital broadcast data that have favorable manufacturing costs.

It therefore would be desirable to provide systems for processing digital broadcast data that have favorable energy consumption rates.

SUMMARY OF THE INVENTION

A system and/or method for providing digital video data processing at high throughput rates, substantially as shown in and/or described in connection with at least one of the figures, as set forth more completely in the claims.

BRIEF DESCRIPTION OF THE DRAWINGS

The objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
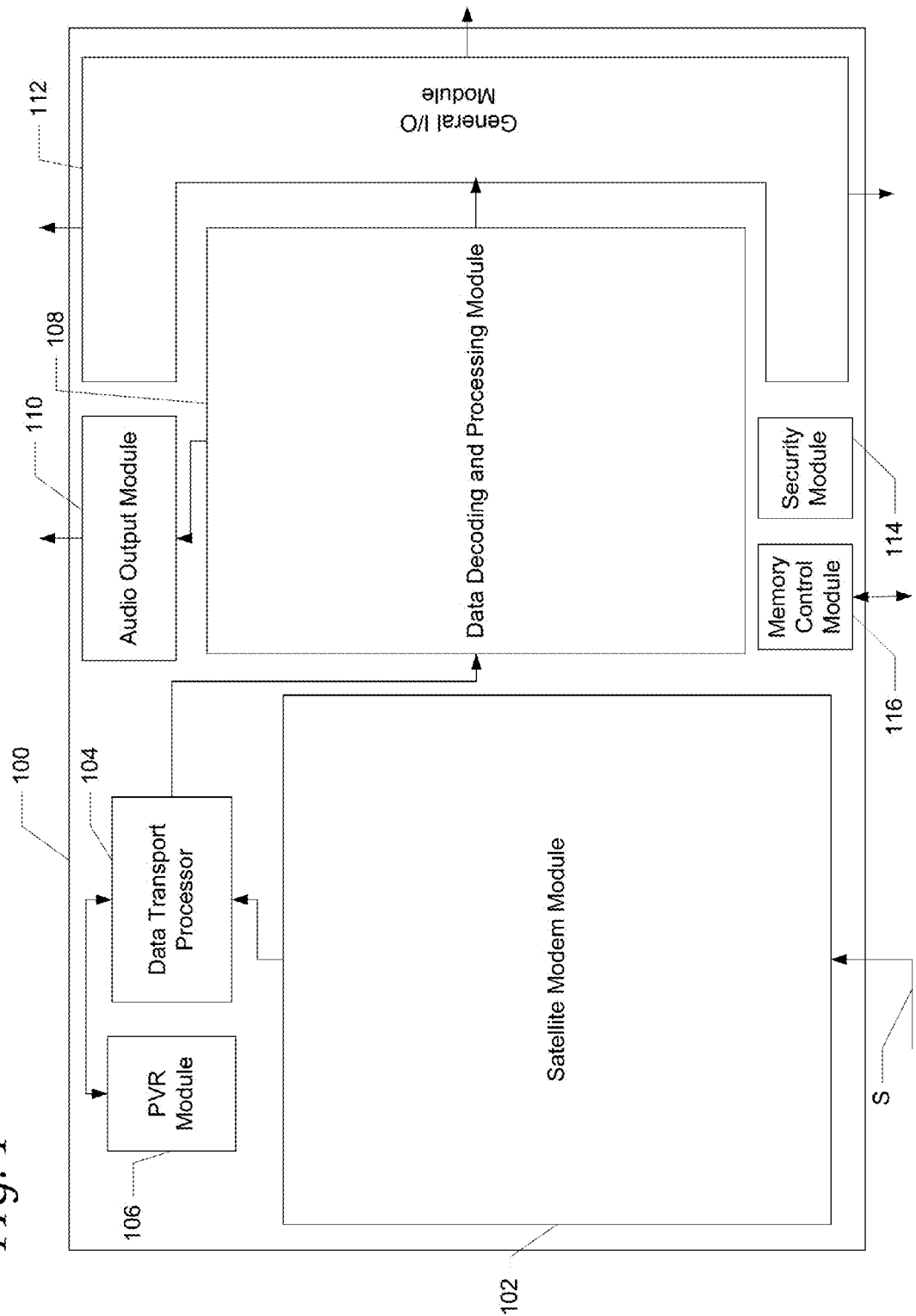
FIG. 1 shows a schematic diagram of apparatus in accordance with the principles of the invention.

Devices and methods for receiving, processing and formatting digital video data are provided. It will be understood that the term "programming information," as used herein, includes video, audio and textual data. Some embodiments of the invention may include a single semiconductor chip on which is imprinted a radio frequency signal tuner module and a personal video recorder ("PVR") module. The PVR module may be configured to receive programming information from the radio frequency signal tuner module. The PVR module may provide a user of a set-top box with digital video recorder functionality, such as "pause," "playback" and "rewind." The PVR module may be configured to communicate the programming information to an external digital video recorder or storage medium.

One advantage of including the radio frequency signal tuner module and the PVR on the same chip is reduced power consumption. Another advantage is reduced package size. Reduced package size may reduce bills of materials for manufacturing. Table 1 shows performance metrics of a single chip device compared to those of a two-chip device.

TABLE 1

Performance comparison between two-chip system and single chip system in accordance with the principles of the present invention. Data are illustrative and approximate.

| Performance Metric | Two-chip system | | | Illustrative single chip system in accordance with the principles of the present invention (e.g., Broadcom 7335) Totals for illustrative single chip |
| --- | --- | --- | --- | --- |
| | Tuner (eg., Broadcom 4506) | PVR (e.g., PVR Portion of Broadcom 7405) | Totals for 2-chip | |
| Power consumption (W) | 3 | 5.9 | 8.9 | 6.7 |
| Package Area L (mm) × W (mm), Area (mm$^2$) | 14 × 20, 280 | 35 × 35, 1,225 | 1,505[1] | 37.5 × 37.5 (1,406.25) |

[1] L and W are indeterminate. Area is the sum of the tuner area and the PVR area.

Table 1 shows that an illustrative single chip device of the present invention may require only about 6.7 W, as compared to about 8.9 W that is required by a two-chip system having a tuner and a PVR on separate dies. Table 1 also shows that an illustrative single chip of the present invention requires only about 1,406.25 mm$^2$ of die area, as compared to about 1,505 mm$^2$ that is required by a two-chip system having a tuner and a PVR on separate dies.

The radio frequency tuner module may include a first radio frequency input channel and a second radio frequency input channel. Each of the first and second radio frequency input channels may include an integrated tuner, a demodulator, a decoder stage and a multiplexer. The radio frequency signal tuner module may include a system oscillator and a phase-locked loop ("PLL") circuit configured to generate a clock signal based on an off-chip crystal. The phase-locked loop circuit may be configured to transmit the signal to the display interface module and to any other suitable modules on the chip. The system oscillator may be the reference clock for processes occurring on the semiconductor chip. By including the system oscillator in the tuner module, the tuner may receive a cleaner (less noisy) clock signal than if the clock signal were propagated to the tuner module from a relatively distant portion of the semiconductor chip.

Some embodiments of the invention may include a system for receiving radio frequency signals and outputting digital data for communication. The system may include (1) a data transport module that is imprinted on a semiconductor substrate; (2) a PVR module that is imprinted on the semiconductor substrate; and (3) a circular memory module for buffering data flow between the transport module and the PVR module. The circular memory module may be imprinted on the semiconductor substrate.

Some embodiments of the invention may include a system for receiving radio frequency signals and outputting digital data for communication. The system may include a first circuit that is imprinted on a semiconductor substrate and is configured to receive a data stream from a data transport module that is imprinted on the substrate; and a second circuit that is in communication with the first circuit, is imprinted on the substrate and is configured to selectively output the data stream. The second circuit may be configured to output the data stream to one of a storage module and an AV port, the AV port configured to be engaged with a display device input port.

The modules and circuits described herein may be imprinted on the semiconductor chip using 65 nanometer lithography. Illustrative processes that may be used in accordance with the principles of the invention are the 65 nanometer CMOS fabrication processes offered by United Microelectronics Corporation (Woodlands, Singapore), Taiwan Semiconductor Manufacturing Company, Ltd. (Hsin-Chu, Taiwan) and Chartered Semiconductor Manufacturing (Woodlands Industrial Park, Singapore) and others.

FIGS. 1-11 show illustrative features of the invention. It is to be understood that other embodiments may be utilized and structural and functional modifications may be made without departing from the scope and spirit of the present invention.

FIG. 1 shows semiconductor chip 100. Semiconductor chip 100 is configured to receive programming information signal S. Signal S may be a satellite broadcast signal. Chip 100 is configured to demodulate signal S, decode signal S, process signal S and output signal S in a wide range of formats. It will be appreciated that signal S will undergo transformations in the modules shown and described herein. For the sake of clarity, the reference letter "S" may be used to identify the signal or a portion of the signal at more than one stage of processing by a semiconductor chip.

Chip 100 may include satellite modem module 102 for receiving signal S. Satellite modem module 102 may include one or more tuner channels (not shown) for decoding signal S. Satellite modem module 102 may demodulate signal S and provide to data transport processor 104 data transport streams that are based on signal S. Data transport processor 104 may be configured to receive the data transport streams and perform operations on the data transport streams to prepare decodable streams for video, audio and graphics processing.

Chip 100 may include PVR module 106. PVR module 106 provides a user of chip 100 with the ability to manipulate the programming information in signal S. Some of the functions of PVR module 106 may be similar to those available on a digital recording device. For example, PVR module 106 may enable the user to display, pause, rewind, playback and record some or all of the programming information in signal S.

PVR module 106 is shown in FIG. 1 as a separate module from data transport processor 102. In some embodiments, PVR module 106 may be integrated into data transport processor 102.

Data transport processor 104 may feed signal S to data decoding and processing module 108. In some embodiments of the invention, signal S flows through data decoding and processing module 108 as compressed digital data or digitized baseband analog video. Data decoding and processing module 108 may include one or more suitable decoders and a video processing state. In the video processing stage, appropriate scaling can be applied to signal S. Also, video programming resulting from the scaling may be stored in memory for later display. During video processing, any graphics or additional video can be combined just before being displayed. The processed signal S may be to a video encoder for display through an appropriate on-chip output port.

Data decoding and processing module 108 may include an audio processing core (not shown). The audio processing core may include a DSP subsystem ("RPTD") and an audio input/output module (AIO). The RPTD is a DSP system block for decompression of MPEG, Dolby Digital, MPEG-2 AAC, MPEG-4 AAC, and Dolby Digital Plus audio services. The DSP system may also support a second digital audio path that allows simultaneous output of a digital audio service in compressed form on SPDIF. The audio processing core may feed an audio component of signal S to audio output module 110. Audio output module 110 may be configured to provide to external devices analog or digital audio output based on signal S.

Data decoding and processing module 108 may provide signal S to general I/O module. I/O module 112 may include interfaces for smart cards, test circuitry, BSC, analog video, component video, S-video, composite video, HDMI television, channel 3/4 television, 656 analog video, soft modem, USB, Ethernet, SATA-2 and volatile or non-volatile memory devices.

Chip 100 may include security module 114. Security module 114 may be any suitable processor that may be used to screen data transfers and/or restrict access to chip 100. In some embodiments, security module 114 may be a module available from Broadcom. Security module 114 may support multimedia applications that provide security for programming information. The applications can range from single-purpose conditional-access (CA) for watching-TV-only STB to multi-purpose copy-protection (CP) for Personal Video Recorder (PVR) STB and digital rights management (DRM) for a multimedia gateway system. Security module 114 may include security components that are required in satellite and cable STBs and various CA and CP standards, such as CP for CableCard and SecureVideo Processor (SVP). Security module 114 may support implementations of a variety of security algorithms, whether open or proprietary. Security module 114 may include a small real-time operating system ("OS") kernel that runs on its own master processor.

Chip 100 may include memory control module 116 for controlling I/O operations of high speed memory.

Data transport processor 104 may be in communication with (or include) personal video recorder ("PVR") interface module 106. PVR interface module 106 may process compressed streams for personal video recording. PVR interface module 106 may have a recording mode, in which transport packets associated with programming information are selected, based on one or more transport stream PID, for recording to a circular buffer in DRAM. PVR interface 106 may transfer the transport packets to a hard disk drive (HDD) (not shown) that is not on chip 100. The compressed data is optionally scrambled using a mem-to-mem security block (shown in FIG. 2).

Video elementary stream ("ES") data contained within the selected PID is searched for the presence and location of selected start codes, such as PES packet headers, sequence start codes, picture start codes, and the first slice start codes within each picture. Sufficient data from the compressed streams following the start codes is also retained to determine the picture type (I, B, or P) and other pertinent information. All of the selected information may be written to memory in a circular buffer to facilitate additional processing by an on-chip MIPS and to record the data to the HDD.

In some embodiments of the invention, PES packets can be recorded instead of data transport streams. PVR interface module 106 may have a playback mode. In PVR playback, data transport processor 104 may read linked lists of compressed audio and video from DRAM, optionally descramble it using the mem-to-mem security block, and process it for decompression and display. The PVR playback mode may have capabilities for fast and slow decoding and descrambling, and data flow management in the absence of a physical time base associated with the stream (as would normally be present in broadcast operation).

Figure 2:
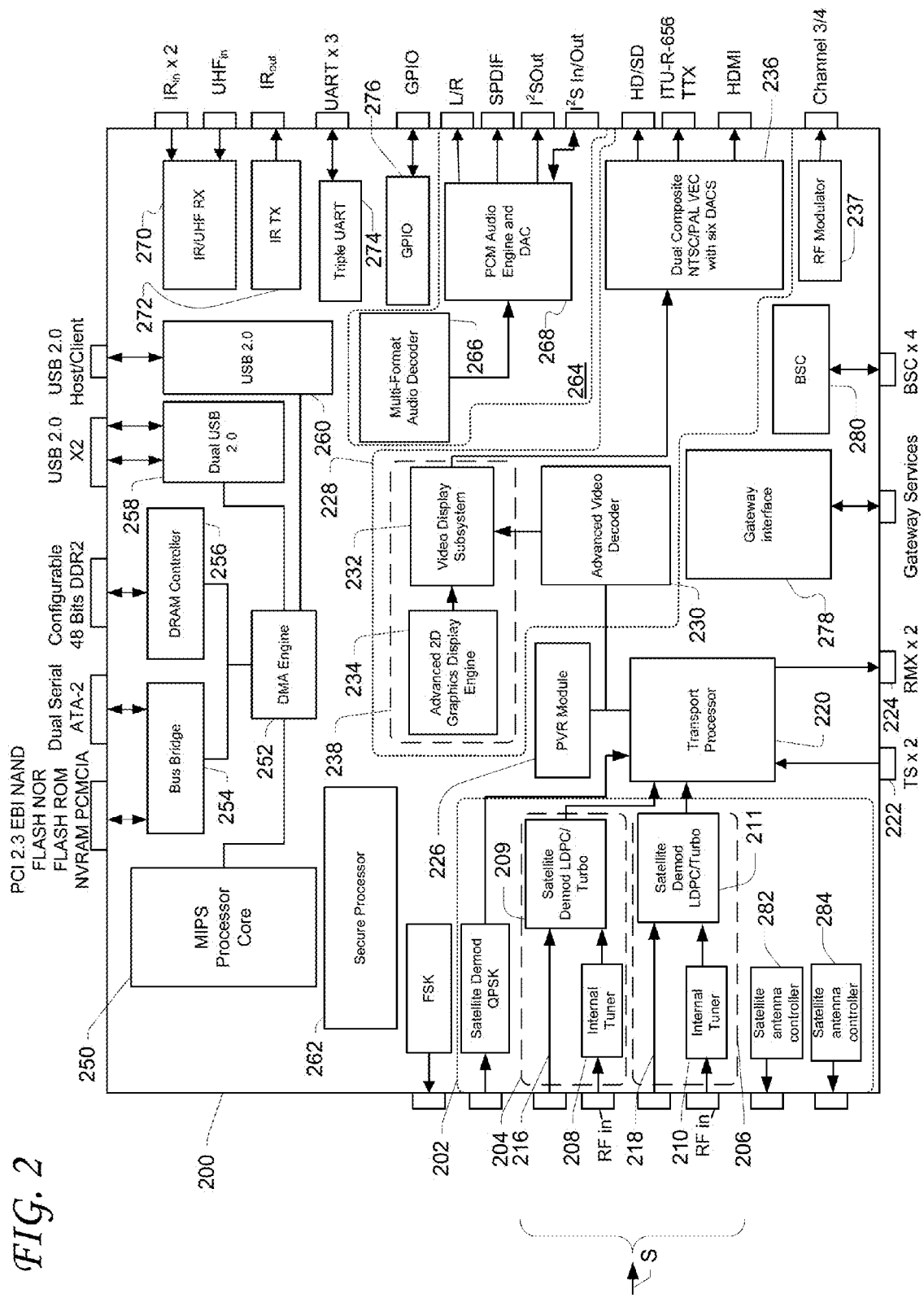
FIG. 2 shows a schematic diagram of portions of the apparatus of FIG. 1.

FIG. 2 shows illustrative semiconductor chip 200. Chip 200 may include some or all of the features of chip 100. Chip 200 may include satellite modem 202, which may correspond to satellite modem 102 (shown in FIG. 1). Satellite modem 202 may include dual tuner circuits 204 and 206. Tuner circuits 204 and 206 may include internal tuners 208 and 210, respectively. Tuner circuits 204 and 206 may include demodulators 212 and 214, respectively.

Satellite modem 202 may feed data transport streams to data transport processor 220, which may correspond to data transport module 104 (shown in FIG. 1). PVR module 226, which may correspond to PVR module 106 (shown in FIG. 1), may provide digital video recorder functionality to data transport processor 220. Data transport processor 220 may feed decodable data streams to data decoding and processing module 228. Data decoding and processing module 228 may have features that are similar to those of data decoding and processing module 108 (shown in FIG. 1). Data decoding and processing module 228 may include advanced video decoder 230, which decodes the streams, video and graphics display module 238, which generates scaled composited images based on the decoded streams, and dual composite NTSC/PAL video encoder ("VEC") 236, which encodes the images for television display.

Chip 200 may include MIPS processor core 250. MIPS processor core 250 may control processes on chip 200. MIPS processor core 250 may operate at any suitable clock rate, including, for example, at 400 MHz. Core 250 may be a MIPS 4380 and may be fully MIPS32 compatible. Core 250 may include MIPS 32e and MIPS16e extended instruction sets, 32KI and 64 KD memory management units, a floating point unit, an 8K read-ahead cache and a 128 K level 2 cache memory.

Direct memory access ("DMA") engine 252 may control data exchange between chip 200 memory (dynamic random access memory ("DRAM"), not shown) and other devices.

Chip 200 may include bus bridge 254 for exchanging data with off-chip devices that operate under formats such as PCI 2.3, EBI (a Flash memory busing protocol) NAND, FLASH NOR, FLASH ROM, NVRAM and PCMCIA. Bus bridge 254 may also exchange data with off-chip devices that operate under dual series ATA-2 and other such formats.

Chip 200 may include DRAM controller 256. DRAM controller 256 may control the DRAM. DRAM controller 256 may interface with off-chip devices that operate under formats compatible with configurable 48-bit double data rate two synchronous dynamic random access memory ("DDR2") devices.

Chip 200 may include any suitable USB interfaces, such as dual USB 2.0 interface 258, for interfacing with two-channel USB 2.0 devices, and USB 2.0 interface 260 for interfacing with USB 2.0 devices under a client/host protocol.

Secure processor 262 may provide secure boot key generation, management, and protection.

Chip 200 may include audio decoding and processing module 264. audio decoding and processing module 264 may have features similar to those of audio output module 110 (shown in FIG. 1). Audio decoding and processing module 264 may receive audio information from data transport processor 220. The audio information may be buffered in memory after processing by data transport processor 220 and before receipt by audio decoding and processing module 264. Audio decoding and processing module 264 may include multi-format audio decoder 266 and pulse-code modulated ("PCM") Audio Engine and DAC 268. Audio decoding and processing module 264 may include data and instruction memories and may be configured to parse audio and timing data from data transport processor 220. Audio decoding and processing module 264 may decompress compressed data, provide time stamp management, and process PCM data. Audio decoding and processing module 264 may include an FMM, an HIFIDAC, and audio input/output interfaces. Audio decoding and processing module 264 may capture $I^2S$ data and perform mixing and volume control of playback data. Audio decoding and processing module 264 may output data to L/R-, $I^2S$-, SPDIF- and HDMI-formatted devices, RF modulator 237 and an HIFIDAC (not shown). Chip 200 may include an $I^2S$ output port and an $I^2S$ I/O port.

Chip 200 may include interfaces for communication of any suitable set-top box control signals from off-chip devices. The interfaces may include, e.g.: IR/UHF receiver 270, IR transmitter 272, triple UART interface 274, and general purpose I/O ("GPIO") interface 276. Each of the interfaces may have any suitable number of channels. For example, IR/UHF receiver 270 may receive signals from a two-channel IR transmitter. UART interface 274 may receive input from a three-channel device.

Chip 200 may include gateway interface 278. Gateway interface 278 may provide communication of programming or control information over an off-chip communication network. Gateway interface 278 may include any suitable interface for communication between chip 200 and the communication network. For example, gateway interface 278 may include one or more of a soft modem, an Si305X interface, an Ethernet interface, a 10/100 interface, a BASE-T 2nd interface, an Enet interface, a MAC interface and any other suitable interfaces.

Chip 200 may provide for satellite antenna control via base station controller ("BSC") 280. BSC 280 may receive control signals from an off-chip device. Chip 200 may provide for satellite antenna control via dual satellite antenna controllers 282 and 284. Satellite antenna controllers 282 and 284 may receive input from tuner channels 204 and 206. Satellite controllers 282 and 284 in satellite modem 202 may operate under the DiSEqC protocol.

Elements of chip 200 will now be described in more detail.

Figure 3:
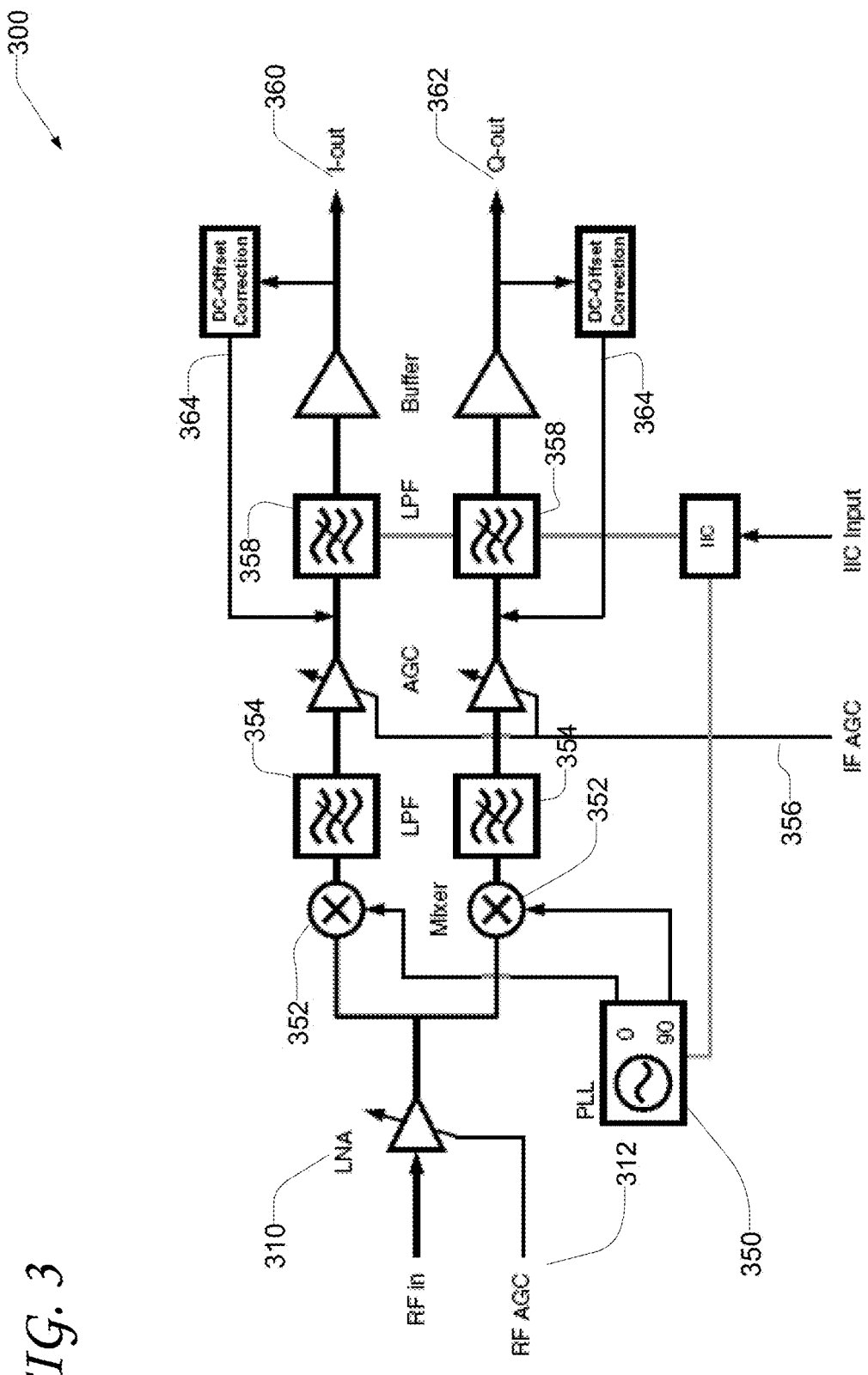
FIG. 3 shows a schematic diagram including details of a portion of the apparatus shown in FIG. 1.

FIG. 3 shows an illustrative embodiment of tuner 300, which may correspond to one or both of tuners 208 and 210 (shown in FIG. 2). Tuner 300 may be a direct conversion tuner. The tuner may accept L-band inputs in the 250 MHz-2150 MHz range and convert them to in-phase and quadrature baseband. The tuner may take in a differential L-band signal from standard consumer grade LNB devices. In some embodiments, off-chip LNA 310 may be required to boost the signal before coming on-chip. A programmable gain amplifier (RF PGA) (not shown) under demodulator AGC loop 312 control adjusts the signal to account for wide dynamic range. Signals required for direct conversion may be generated within the chip by integrated PLL 350 and a quadrature LO generator (not shown). Mixers 352 mix the PLL signal with the L-band input. Low pass filters 354, which may be integral to the corresponding mixers, remove upper image produced by the mixer.

Programmable gain amplifier ("IF AGC") 356 then adjusts baseband signal levels. Tuner 300 may include channel select filters 358. Channel select filters 358 may optimize noise performance and prevent distortion. Channel select filters 358 may be digitally programmable $5^{th}$ order low-pass Butterworth filters. The Butterworth filters may have programmable bandwidth in the 1 to 40-MHz range. Buffered I/Q outputs 360 and 362 are then sent both off-chip as probe points, and to internal A/D converters in the tuner's demodulator (e.g., 212 or 214). On-chip DC canceller loop 364 may be included to correct DC offsets inherent in the direct conversion mixers, channel select filters, and output buffers.

Tuner channels 204 and 206 may include demodulators 212 and 214, respectively. Demodulators 212 and 214 may receive output from internal tuners 208 and 210, respectively. Demodulators 212 and 214 may receive output from external tuners (not shown), respectively, via paths 216 and 218.

Figure 4:
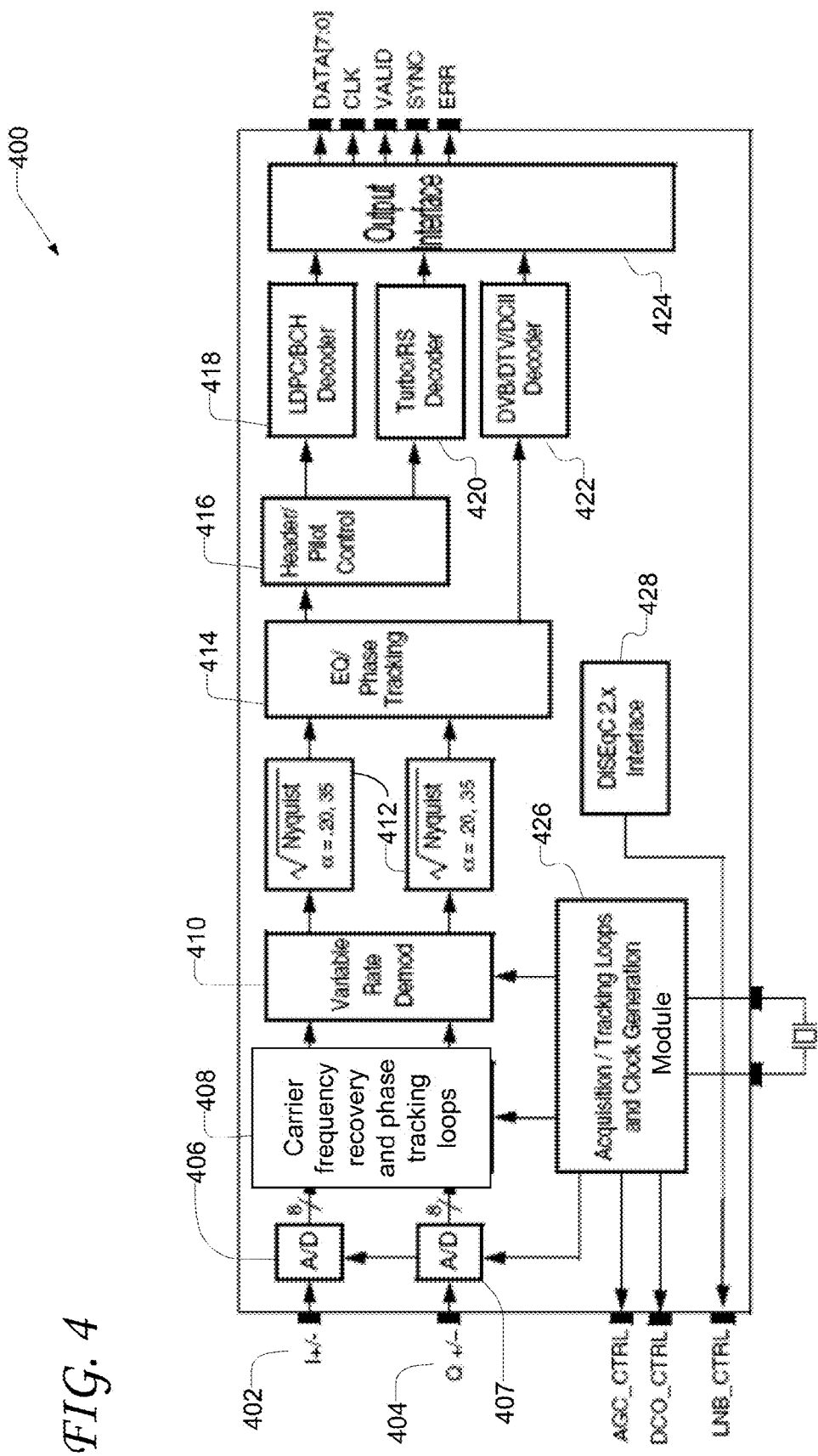
FIG. 4 shows a schematic diagram including details of another portion of the apparatus shown in FIG. 1.

FIG. 4 shows illustrative demodulator 400, which may correspond to one or both of demodulators 209 and 211 (shown in FIG. 2). Demodulator 400 may accept a modulated data stream from an on-chip tuner (such as 208 or 210). Demodulator 400 may deliver a demodulated and error-corrected output data stream for processing by data transport processor 220 (shown in FIG. 2). Demodulator 400 may support legacy DVB/DTV/DCII QPSK formats and DVB-S2 and 8PSK Turbo QPSK/8PSK formats with headers and pilots.

Demodulator 400 may receive real and quadrature signals 402 and 404, which may be based on signal S (shown in FIG. 2, e.g.), from a tuner such as 300 (shown in FIG. 3). Demodulator 400 may pass signals 402 and 404 through A/D converters 406 and 407. A/D converters 406 and 407 may be dual 8-bit converters. A/D converters 406 and 407 may digitize signals 402 and 407 at a programmable sample rate. The rate may be any suitable rate, including about 135 MHz. In some embodiments, the sample rate may be greater than 135 MHz. The sample rate may be chosen to provide 4× oversampling for rates up to 33 MBaud.

A/D converters 406 and 407 may pass output to carrier frequency recovery and phase tracking loops 408. Loops 408 may be high-speed, all-digital phase/frequency circuits capable of tracking out relatively large amounts of frequency offsets and phase noise such as those contributed by conventional tuners and LNBs. Loops 408 may be configured via software (not shown) to use either a decision directed phase detector or a non-decision directed phase detector optimized for low SNR operation. Loops 408 may be filtered by an integral-plus-proportional filter. Programmable integrator and linear coefficients may be provided to set the bandwidth of loops 408. Upper bits of a loop filter (not shown) output may be used to control a complex derotator (not shown). This may provide phase and frequency resolution. Loops 408 may remove residual phase and frequency offsets in the baseband signal.

Loops 408 may pass output to variable rate demodulator 410. Demodulator 410 may output real and quadrature signals to Nyquist filters 412. Nyquist filters 412 may output real and quadrature signals to phase tracking equalizer 414. For DVB-S2 and 8PSK Turbo operation, equalizer 414 may provide output to header/pilot control block 416. Block 416 may assist with acquisition and tracking of physical layer header locations, as well as extracting carrier phase information from the pilots when they are present. Block 416 may provide output, as appropriate, to LDPC/BCH decoder 418 or Turbo/RS decoder 420. For DVB, DTV and DCII operation, equalizer 414 may provide output directly to decoder 422. Decoders 418, 420 and 422 may provide output to data transport processor 220, or any other suitable elements of chip 200, via output interface 424.

Demodulator 400 may include acquisition/tracking loops and clock generation module 426. Module 426 may include an automatic gain control loop to control amplitudes of inputs 402 and 404.

Demodulator 400 may include DiSEqC 2.X interface 428 for tuning a satellite antenna based on data generated from inputs 402 and 404.

Figure 5:
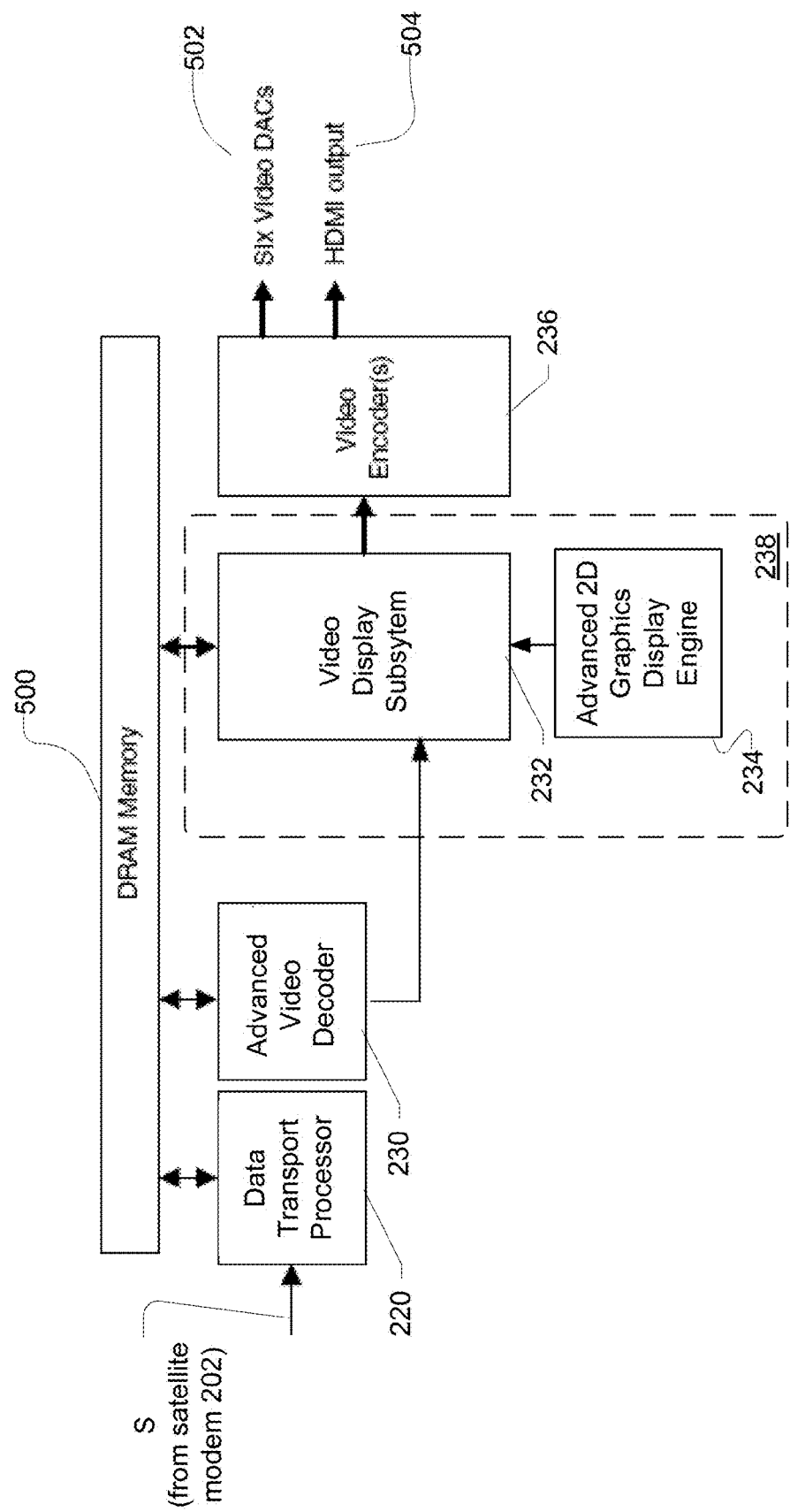
FIG. 5 shows a schematic diagram of yet another portion of the apparatus shown in FIG. 1.

FIG. 5 shows a schematic overview of the flow of signal S in chip 200 (shown in FIG. 2) downstream from satellite modem 202. The signal S may flow as compressed digital data or digitized baseband analog video. From satellite modem 202, signal S may be received by data transport processor 220. Data transport processor 220 may generate decodable streams based on signal S. Data transport processor 220 may store the decodable streams in DRAM 500. (DRAM 500 may be controlled by a memory control module such as 116 (shown in FIG. 1). Advanced video decoder 230 may retrieve the decodable streams from DRAM 500, decode them and restore them in DRAM 500. Video and graphics display module 238 may then operate on the decoded streams. Video display subsystem 232 can apply scaling and compose frames. 2D graphics display engine 234 can combine graphics or additional video with the signal S video. The resulting stream is then sent to one or more video encoders ("VEC"s), such as 236, for display through suitable output interfaces, such as analog DAC outputs 502 and/or HDMI interface 504.

Figure 6:
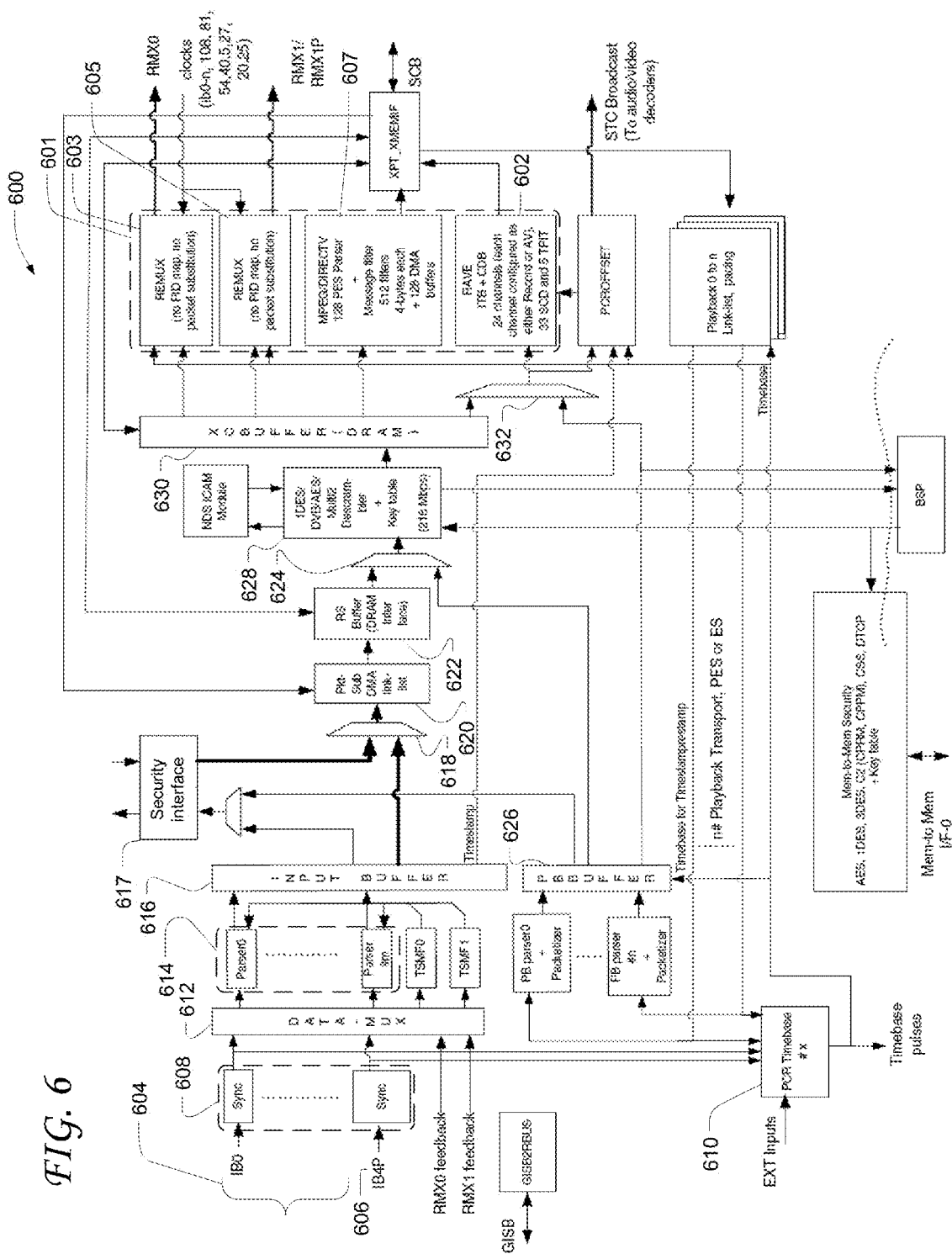
FIG. 6 shows a schematic diagram that includes details of yet another portion of the apparatus shown in FIG. 1.

FIG. 6 shows illustrative data transport processor 600, which may correspond to data transport processor 220 (shown in FIG. 2). Data transport module 600 may be configured to process simultaneously 255 PIDs via 255 PID channels in a number of external streams and playback streams. Data transport processor 600 may support decryption for all 255 PID channels. Data transport processor 600 may include output cluster 601. Output cluster 601 may include remultiplexing ("remux") modules 603 and 605, PID-based MPEG/DIRECTV output module 607 and record, audio, and video interface engine ("RAVE") module 602, which may have one or more of the features described above in connection with data transport processor 104 on chip 100 (shown in FIG. 1).

Data transport module 600 may receive from a satellite modem such as 202 (shown in FIG. 2) serial inputs 604 and parallel inputs 606. Inputs 604 and 606 may be synched by sync block 608 to PCR timebase 610. The inputs may be multiplexed by multiplexer 612, parsed by PID parser 614 and stored in input buffer 616. Data transport module 600 may support up to 128 PID channels for message or generic PES processing and storage. (The storage may include 128 or more DRAM message buffers (not shown) that are integral to chip 100 (shown in FIG. 1). Buffer 616 may receive a time-base signal for time-stamping the parsed data.

Input buffer 616 may maintain a separate 32-bit timestamp counter for each PID parser which can be locked to any chip 200 timebase or to a free running 27-MHz clock. Each packet that is accepted by a PID parser can be optionally stamped using this local timestamp counter. This timestamp can be used for record, playback with pacing, or PCR correction for remux. PCR correction may be necessary while outputting from remux 603 or 605, because packets can remain in the multiplexing buffers for a variable length of time. Timestamp format is programmable-32 bit straight binary or modulo 300 for the nine LSB, similar to the MPEG PCR. Timestamp format can be selected independent of the transport packet format. Playback pacing supports both timestamp formats. However, in some embodiments, PCR correction can only be done when the selected timestamp format is the same as the PCR format. In other words, hardware cannot convert the local timestamps to the format of the PCR within the transport packets. As the packet is being output from the data transport, the only place that the timestamp value can be output with the packet is at the record.

Record mode can select one of the two timestamp modes. In normal mode, the 32-bit recorded timestamp consists of a 4-bit parity and 28-bit timestamp value. In special mode, the 32-bit recorded timestamp consists of a 2-bit user-programmable value and a 30-bit timestamp. A preset starting timestamp value can also be synchronized with the first recorded packet. In addition to recording timestamps with the data, record channel can also attach the timestamp with each SCD entry generated.

During playback, the timestamps recorded with the data can be used to pace the playback data. These timestamps can also be used to do PCR correction if playback data is to be routed out remux 603 or 605. Playback can also extract the two user-programmable bits in the timestamp (for special timestamp mode), and present them in registers for chip 200 MIPS processor core 250 (shown in FIG. 2) to read. In some embodiments, playback pacing must have the same programming of the format and mode of the timestamp as that during record. Record function of time interval packet counting, and PCR out of range detection, may be performed by MIPS processor core 250 software. The purpose of the time interval packet counting is to later navigate within the recorded stream, performing jumps in playback with respect to time. This function is best implemented using the record generated SCD, which provides very accurate navigation data such as picture starts, etc. The SCD also stores PCRs found in the stream, together with their corresponding local timestamp. This allows the software to more accurately determine the PCR errors, and to determine unmarked PCR discontinuities. More robust algorithms can be performed by MIPS processor core 250 to support this function.

Data from input buffer 616 may be multiplexed with security data from security interface 617 (which may be an MPOD) by multiplexer 618. The multiplexed data may then be passed to packet substitution DMA link list 620. Link list 620 may perform packet generation. The packets may then be stored in RS buffer 622. Packets stored in RS buffer 622 may be multiplexed by multiplexer 624 with playback ("PB") packets (in PES, ES or any other suitable format) from PB buffer. The multiplexed packets may then be descrambled by descrambler 628. The multiplexed packets may then be fed to XC buffer 630. Output from XC buffer 630 may be fed to output cluster 601.

Data transport module 600 may include multiplexer 632 for combining PB buffer 626 contents with XC buffer 630 contents.

Data transport module 600 may include 512 4-byte generic filters that may be configured to process MPEG/DVB sections or DIRECTV messages.

Each channel of RAVE module 602 may be configured as a record channel for PVR or as an AV channel to interface to audio and video decoders. RAVE module 602 may support 32 or more SCDs (configured 0-8 per record channel). In some embodiments, each record channel can be configured for any suitable number, such as one to eight, start code detectors ("SCD"). Each channel may be configured for one or more TPITs (maximum of five in the system).

The RAVE module 602 AV channels may be used for interface to the audio/video decoders via an external memory subsystem. Each record channel can be used to record transport streams for up to 255 or more PID channels. A record channel may be allocated one or more external DRAM buffers. One of the DRAM buffers may be for data. One of the DRAM buffers may be for index table entries. Each channel's index table descriptor buffer may contain entries that points to relevant locations within the data buffer. For example, an entry may point to a start code locations, PTS information, or other suitable locations in the buffer. Each record channel can record any suitable number of entry types. In some embodiments, each record channel may support about four types of entries. The four may include a Start Code Detect entry type, a Transport Parser Index Table (TPIT) entry type, a seamless pause entry type and/or a PTS entry type. The start code entries may be used to build start code tables or transport field tables which can then be used during playback to perform trick modes.

In RAVE module 602, RASP, as defined by NDS, can be supported using TPIT. Any suitable number of record channels may be configured for the TPIT function. In some embodiments, about 6 record channels may be configured for the TPIT function. A local timestamp may be generated at an input buffer via an internal counter using a clock that is selectable from any of three available locked timebases, or a free-running system clock. The clock may be a 27-MHz clock. A local timestamp may be prepended, for example as a 32-bit field, to one or more recorded transport packet. The 32-bit timestamp format may be programmable. In one mode, the timestamp may include a 28-bit local timestamp plus a 4-bit parity which can be used during playback to transmit the packets at a rate equivalent to when they were recorded. In some embodiments, the 4-bit parity may be used for PCR correction in the remux modules 603 and 605. In another mode, an upper two bits of the 32-bit timestamp field may be user programmable. In that mode, the remaining bits may be the timestamp.

In some embodiments, a record channel may support index table generation. Although index table generation involves more than indexing start code table entries, the index table generation feature may be referred to herein as a SCD. An SCD may record a position of a PES packet header stream_id and an elementary stream start code within a recorded transport stream for a given PID. The SCD may operate in accordance with one or more transport modes of operation. One transport mode of operation is MPEG. Another is DIRECTV.

A data structure for data stored in the memory buffer may be a start code index table. The start code index table may be detailed in a Record Index Table Definition section of the buffer. Within each transport mode (MPEG and DIRECTV), any suitable number of index table modes may be implemented.

Four index table modes may be supported. In some embodiments, all of the modes utilize a six-word index entry. Four index entry types are supported: Start Code (SC), Presentation Time Stamp (PTS), Transport Field (TF), and Seamless Pause (SP). The SC index entry may provide offsets to start-code locations within an associated record buffer. The PTS index entry may provide PTS values that were extracted from the recorded stream. The TPIT transport field parser may store transport field index entries. For on-change conditions, an initial entry is made for detection of a first PID. For example, if a first packet for a PID with the transport_scrambling_control_change_en bit set has a scrambling control of 10, an index table entry is stored for the transport_scrambling_control_change condition with the transport_scrambling_control_change bit set and the actual value of the scrambling_control of 10 is stored in the scram_control field.

The seamless pause feature may be used with playback. The seamless pause feature may allow live viewing of a program with the capability of pausing the program. The program initially may be viewed without going through the record/playback path. This may eliminate channel change latency that may be incurred when going through record/playback path. When a user wishes to pause the program, a record channel may be enabled with the appropriate PID channels selected for record. Then REC_PAUSE_EN is asserted. This assertion may prevent the selected PID channel data from being sent to the audio/video decoders. The user may see this as a pause. Once REC_PAUSE_EN is set, the next packet that is recorded may have a seamless pause entry made in the record index table (if the index table is enabled). When the user wishes to resume the program, the stream may now come from a playback channel instead of the live channel. The index table entry made for seamless pause may be used to determine where to start the playback.

FIG. 2 shows that data transport module 220, which may correspond to data transport module 600 (shown in FIG. 6), may communicate with multi-channel ports 222 and 224. Port 222 may receive a data transport stream from an off-chip source. Port 224 may provide to an off-chip processor a remultiplexed data transport stream.

Output from data transport processor 220 may be processed by data decoding and processing module 228 (see also FIG. 5). Data decoding and processing module 228 may include high definition AVC/MPEG-2//MPEG-4/VC-1 video decoder 230, video display subsystem 232, advanced 2D graphics display engine 234 and dual composite NTSC/PAL VEC with DACS 236. (See also FIG. 5.) Data decoding and processing module 228 may provide output signals in any suitable format. For example, data decoding and processing module 228 may provide HD/SD, ITU-R-656 TTX, HDMI or any other suitable format. Chip 200 may include any suitable circuits, such as those shown in FIG. 2, for providing signals in suitable formats based on the output of transport processor 220 and or PVR module 226. Chip 200 may include RF modulator 237 for providing analog Channel 3/4 output.

Figure 7:
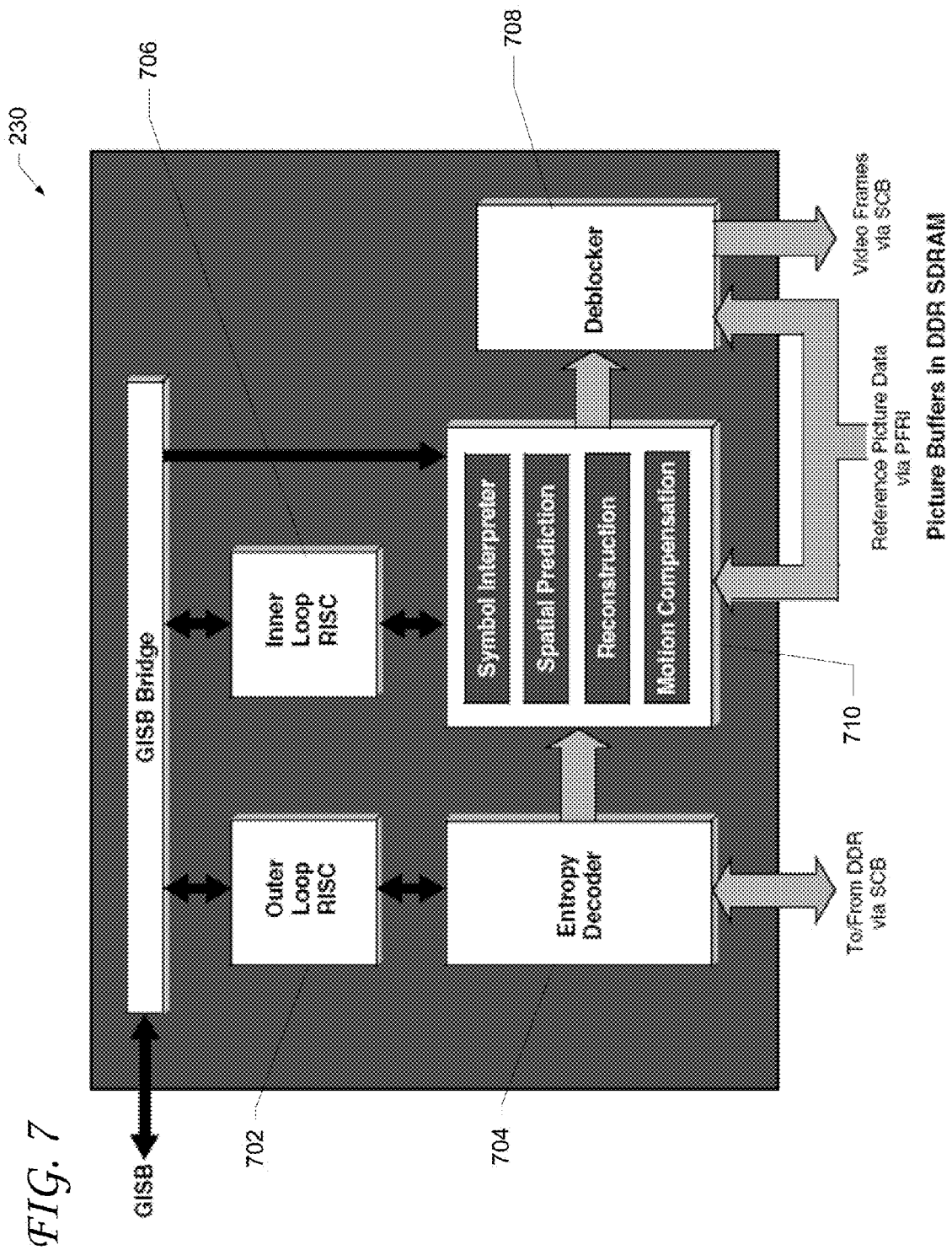
FIG. 7 shows a schematic diagram of another portion of the apparatus shown in FIG. 1.

FIG. 7 schematically shows an illustrative of features of AVD 230. Advanced video decoder ("AVD") 230 may be a high-definition AVC/MPEG-2/VC-1/DivX/MPEG-4 P2 video decoder core. AVD 230 retrieves elementary stream video data placed into SDRAM (not shown) by data transport processor 220, decodes the video, and writes the decoded pictures back to SDRAM to be retrieved by a video feeder in video display subsystem 232. The AVD core is capable of decoding one or more encoded elementary streams. The processing of such a stream has two major components: front-end processing (the conversion of the code stream into fundamental components—motion vectors, transform coefficients and the like) and back-end processing (actual generation and manipulation of pixels). FGT block average logic is optional. FGT block average logic may compute block averages as an assist to the downstream FGT logic. When enabled, FGT block average logic may monitor decoder pixel output and use the results of the monitoring to calculate 8×8 block averages, which are written to main SDRAM memory.

AVD 230 may decode any suitable code streams, such as: H.264/AVC main and high profile to level 4.1; VC-1 advanced profile @level 3; VC-1 simple and main profile; MPEG-2; MPEG still-picture decode; MPEG-4 Part 2 and DivX 3.11, 4.11, 5.X, 6.X. AVD 230 may support tools added in the AVC Fidelity Range Extensions ("FRExt") amendment, specifically 8×8 transform and Spatial Prediction modes, and adaptive quantization matrix required for High Profile support. In some embodiments, AVD 230 may include one or more of the following features: error concealment and multiple-stream support for any suitable number of low-resolution streams. For example, AVD 230 may include multiple-stream support for sixteen low-resolution streams.

AVD 230 stores images in a striped format that may optimize two-dimensional transfers. The images are stored in 4:2:0 format, with luminance separate from chrominance. In some embodiments of the invention, picture buffer management is under software control. AVD 230 may include outer-loop RISC processor 702. Processor 702 may pass information about each display frame to an external video feeder (not shown—outside AVD 230), which can pick it up out of memory. The optional FGT block average logic writes averages for 8×8 block averages for a frame, and for the 4×8 sums for field 0 in interlaced mode. Each 8×8 average is 8 bits, and is stored in Y0-Y1-Y2-Y3-Cb-Cr order, in MB raster order. The averages are written starting at the software programmed base address, and are written linearly without any holes. The 4×8 sums are 16 bits each, and are also written out in Y0-Y1-Y2-Y3-Cb-Cr order. The sums may use two times as much space as the averages.

Coded data is presented to AVD 230 as a linked list of packet entries, each entry corresponding to a network abstraction layer ("NAL") unit. Multiple streams are handled by multiple instances of linked lists. As NAL units accumulate in memory, outer-loop RISC processor 702 examines them and passes them to entropy decoder 704. Decoder 704 reads header information.

If a stream is CABAC-encoded, outer-loop RISC 702 then sets up a CABAC-to-BIN decoder to generate a BIN representation. For CAVLC-encoded streams, this operation may not be necessary. Once outer-loop RISC 702 determines that it has enough data to start decoding, it passes a structure to inner-loop RISC 706, which then starts inner-loop processing using one pass per image slice. Inner-loop RISC 706 may direct a symbol interpreter to parse the data stream, from the BIN buffer for CABAC streams, or the code buffer for CAVLC streams. The symbol interpreter converts the variable-length symbols to data values, and contains blocks to convert those values to spatial prediction modes, motion vector deltas, and transform coefficients. These elements are then used for further video processing by a module that performs actual pixel reconstruction. FIG. 7 also shows a deblocker 708 and a schematic configuration of a symbol interpreter, spatial predictor, reconstructer and a motion compensation module 710. Both the deblocker 708 and the aforementioned schematic configuration may receive reference picture data.

Figure 8:
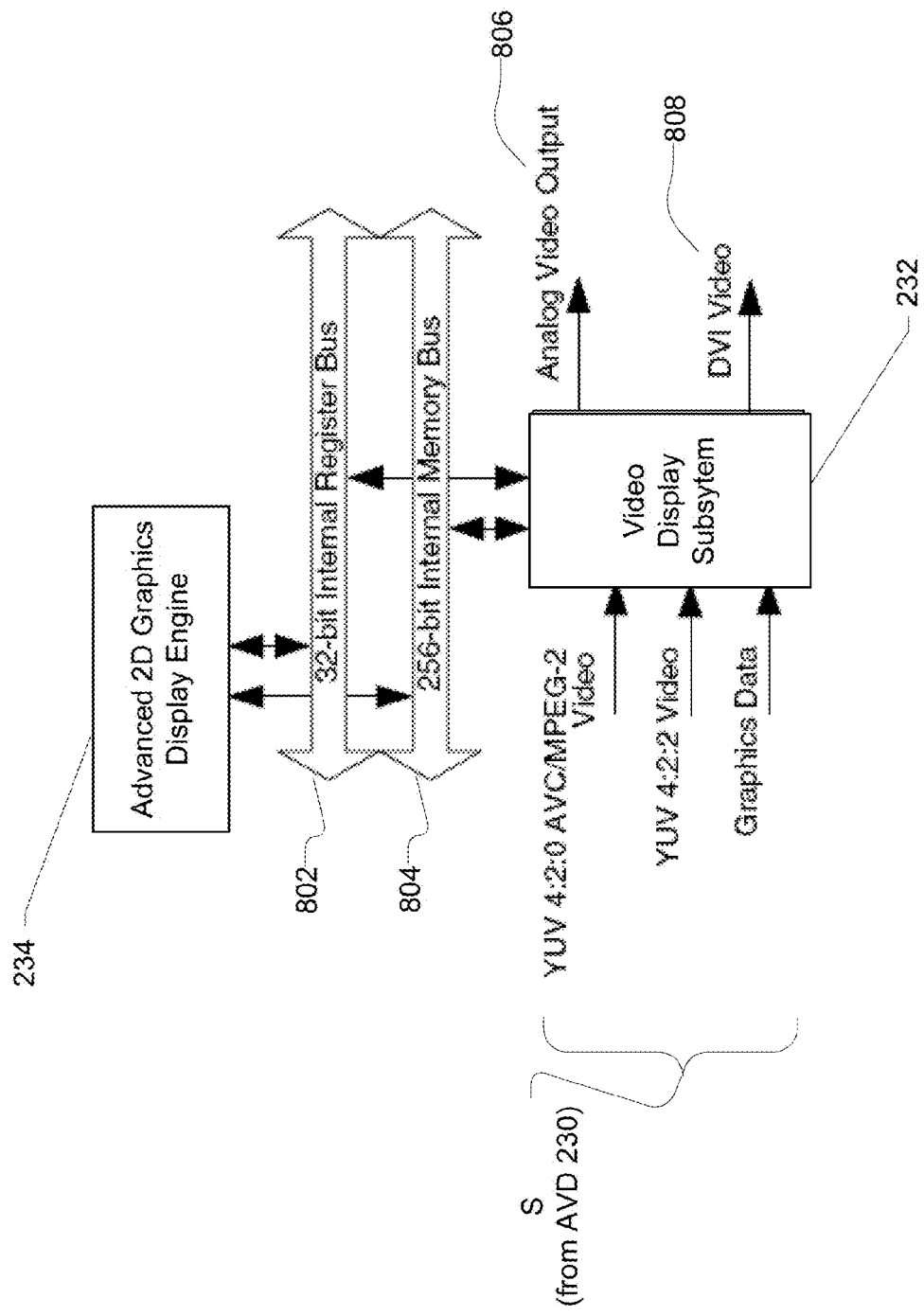
FIG. 8 shows a schematic diagram of yet another portion of the apparatus shown in FIG. 1.

FIG. 8 shows an overview of an illustrative architecture for video and graphics display module 238. In video and graphics display module 238, video display subsystem 232 receives a signal S feed (from AVD 230). Advanced 2D graphics engine 234 may provide graphic data to be combined with programming information from signal S. The graphic data may be registered against the programming information using register bus 802 and memory bus 804. The combined data may then be output by video display subsystem 232 as analog video output 806 or DVI (Digital Video Input) video output 808. Video output 808 provides a decompressed decoded external video signal. Analog video output 806 may be provided to a video encoder such as 236 (shown in FIG. 2) for output to a display device.

AVD 230 may pass decoded AVC/MPEG/VC-1 or analog video to video display subsystem 232. Video display subsystem 232 may perform compositing of text and graphics with video. Video display subsystem 232 may take in uncompressed video from AVD 230 or advanced 2D Graphics Display Engine 234. Video display subsystem 232 may processes the input videos based on the input and output format, and any appropriate system requirements. The input video may be scaled and converted to the output display format directly, or go through single and multiple capture and playback loops. Each capture and playback loop may involve data processing like DNR, MAD-IT, or scaling. Video display subsystem 232 may allow a user to create a series of frame-buffers that allow an unlimited number of graphics layers to be composited and blended together before being displayed. Once the graphical frame-buffers are available, they can be combined with the video using a compositor. The compositor allows up to two video surfaces to be combined with a graphical surface (frame-buffers). In some embodiments, the blending order of any surface may be controlled by software.

In some embodiments, graphic surface generation may be separate from the real-time display requirements of the video output. Once the graphics surface is available, it can be switched in for display. In some embodiments, all of the graphics development interacts only with the memory—not with any of the display hardware. Video display subsystem 232 may provide dual video output with independent graphics on each output.

Video display subsystem 232 is based on a video network that may include a digital noise reduction filter to reduce MPEG artifacts, including block noise, and reduce mosquito noise; a digital contour removal function; AVC/MPEG/VC-1 feeders (that may handle the YUV4:2:0 data format); graphics feeders (that may handle the YUV4:2:2 and RGB data formats); video feeders (that may handle YUV4:2:2 data formats); video scalers (including, in some embodiments, 2D scalers using an flexible FIR algorithm); a motion adaptive deinterlacing function (which may include adaptive deinterlacing for 480i or 576i input formats to 480p, 576p, 720p, and 1080i resolutions and 3:2/2:2 pull-down detection and adaptive 3:2 pulldown progressive frame filtering); capture blocks (which may store YUV4:2:2 data formats); one or more video compositors (for combining video and graphics); and film grain technology ("FGT") for adding film grain to decoded video.

Advanced 2D graphics display engine 234 may include a 2D memory-to-memory compositor. The compositor may include features for scaling, BLT functions and ROP operations.

Figure 9:
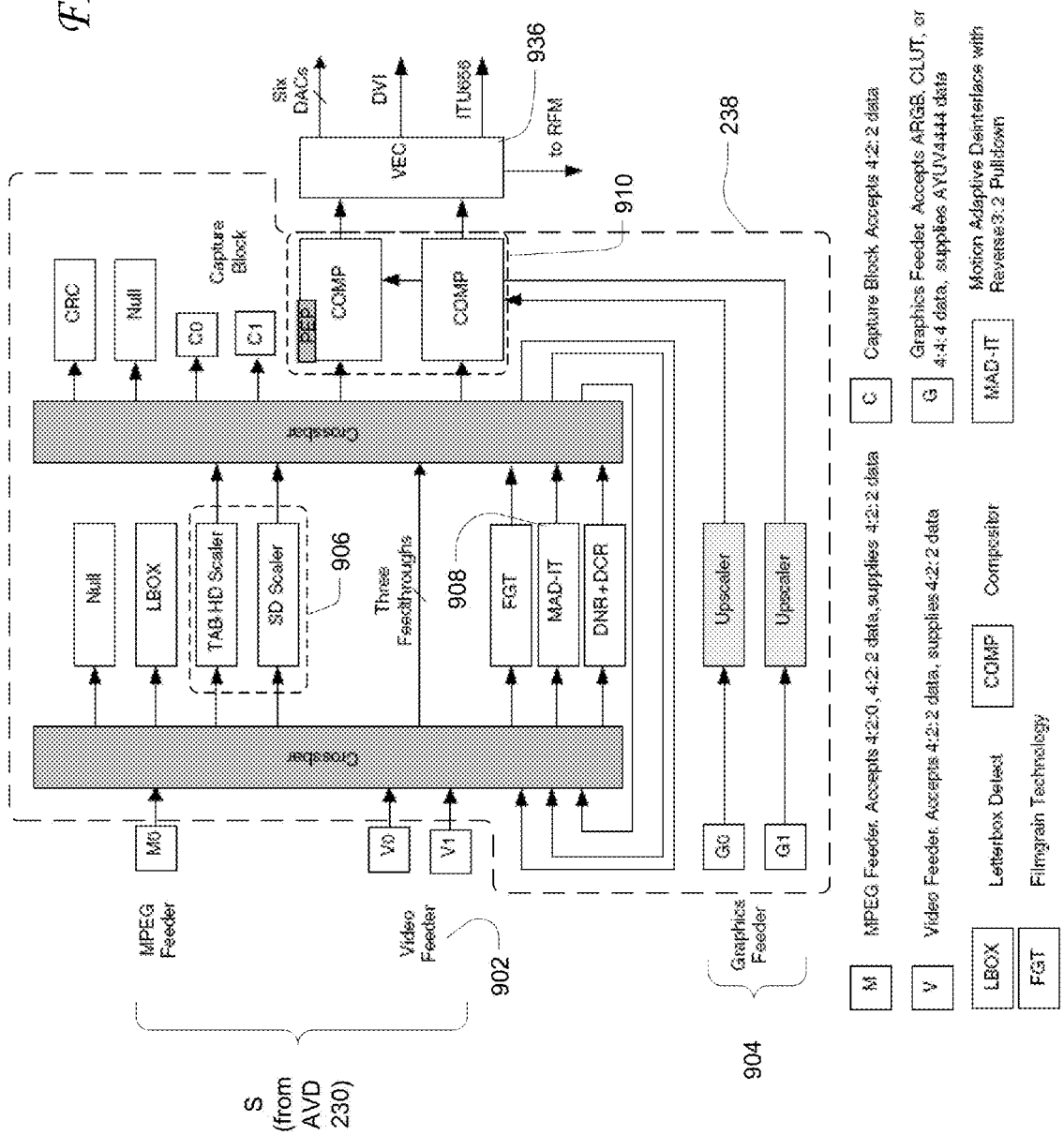
FIG. 9 shows a schematic diagram of still another portion of the apparatus shown in FIG. 1.

FIG. 9 shows video and graphics display module 238 in more detail. Video and graphics display module 238 receives input signal S from AVD 230. The feeder supports a number of frame buffer formats. In addition, a number of frame buffer formats commonly used by software codecs are included and registered in Microsoft as Four-Character Code (FOURCC). The scope is limited to 4:2:0 and 4:2:2 formats only, and other formats are not supported (such as 4:4:4). The AVD 230 feeder is capable of HD resolutions and can support pan-scan operations.

AVD 230 may use a linear image format. Image data may be stored in DRAM in a striped format i.e., slicing an image into a series of equal-sized vertical strips and then tacking the strips together. The height of a stripe is a programmable parameter, this must be at least as large as the 'tallest' image that will be stored in the buffer. It is generally made a little larger than that to achieve optimal DRAM bank alignment. Though the stripe width is programmable but feeder supports only 64-bytes stripe width. A picture in AVD 230 format contains two separate arrays, one is for luma (Y) components, and the other is for chroma (Cb and Cr) components. Chroma components are stored Cb/Cr interleaved, with the same stripe width and a programmable stripe height. Packed YUV For a 4:2:2 picture, pixels are paired together as CbYCrY quadruplets. They are organized in a raster scanning order. There are a number of permutations within a quadruplet. They are represented in FOURCC as: CbYCrY (UYVY); YCbYCr (YUY2); and YCrYCb (YVY2).

Video feeder 902, shown in FIG. 9, may support a subset of the number of frame buffer formats that the AVD 230 feeder supports. Packed For a 4:2:2 picture, pixels are paired together as CbYCrY quadruplets. They may be organized in a raster scanning order. There may be a number of permutations within a quadruplet. The permutations may be represented in FOURCC as: CbYCrY (UYVY); YCbYCr (YUY2); YCrYCb (YVY2).

Graphics feeder shown in 904 may support 4:4:4 or ARGB formatted graphics or video. The 4:4:4 data may require that the data be stored in one of the following selections: 32-bit formats (e.g., AYCrCb_8888; YCrCbA_8888; ARGB_8888; and RGBA_8888); 17-bit format (e.g., W_RGB_1_565); 16-bit format (e.g., RGB_565; WRGB_1555; RGBW_5551; ARGB_4444; RGBA_4444; and AP_88); 8-bit format (e.g., A_8-P_8); or any other suitable format (such as P_4; P_2; P_1; P_0; A_4; A_2; and A_1). A horizontal scaler may be either inside the graphics feeder or just downstream from it. The scaler can handle horizontal upscaling, and may have an 8-tap filter for the up-scaling function.

Video scaler 906 may support SD and HD data. In the scaler, sampling position may be maintained internally using two M mod N counters (one horizontal and one vertical). Horizontal and vertical scales may be rounded to the nearest 1/256 pixel. In addition, sampling position can be initialized by a subpixel amount. Four modes of vertical FIR and/or block averaging can be selected. Two optional horizontal halfband decimation filters can be enabled for cascaded operation in high-quality decimation. Horizontal non-linear scaling allows projection of 4:3 material onto 16:9 screen.

Motion adaptive deinterlacer block 908 may convert an interlaced format into a progressive format. This improves the visual quality for progressive displays.

Compositor 910 arranges final construction of the outgoing video. There may be two possible video surfaces. There may be two possible graphics surfaces. Once the order of the surfaces is determined, they are blended together from the bottom up to form the final result. To facilitate blending, the surfaces are all translated into an AYUV4:4:4 format type. This simplifies the blending mathematics. Each compositor input can be manipulated through a matrix to allow manipulation of the individual color components. This can be used for color space conversion as well as contrast, tint, and brightness adjustments.

Figure 10:
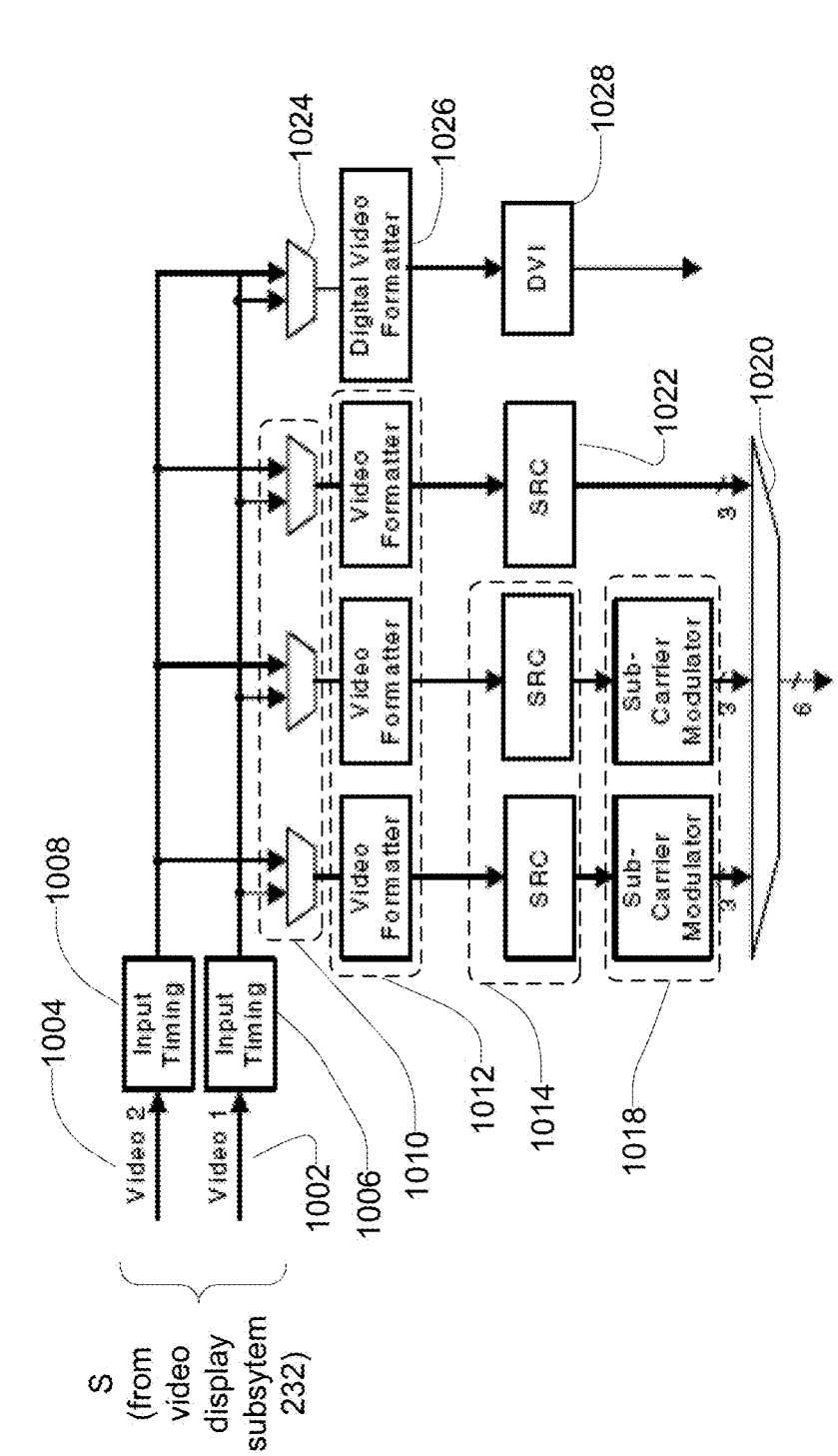
FIG. 10 shows a schematic diagram of still another portion of the apparatus shown in FIG. 1.

FIG. 10 shows illustrative single-channel analog video encoder ("VEC") 1000, which may be duplicated for additional channels. (The single channel appears as two, because two formats—standard definition video and high definition video—based on a single data source are supported.) The architecture of VEC 1000 may be used in VEC 236 (shown in FIG. 2). Analog VEC 1000 may include Macrovision 7.1 and DCS support. VEC 1000 may be configured to process high definition video stream and a standard definition (that is scaled down content from the high definition video stream). VEC 1000 may be a single module that takes a series of video inputs from multiple sources, inserts fly backs (hblank and vblank), formats the signal into multiple valid output video standards, and additionally handles the insertion of non-video signals into the VBI region. The VEC supports a variety of analog video standards (NTSC, NTSC-J, PAL (all variations including PAL-M/Nc)), SECAM, as well as a variety of output formats: composite, S-Video, SCART1, SCART2, component (480i, 480p, 576i, 576p, 720p, 1080i, 1080p24, and 1080p30). The VEC uses a fixed clock architecture.

VEC 1000 may interface with one or more 10-bit video digital-to-analog converters ("DACs"). One or more of the DACs may be based on high-speed CMOS. The DACs may be configured to support SCART1 as well as component, S-Video (Y/C), and composite video (CVBS) outputs.

VEC 1000 may receive signal S via input leads 1002 and 1004, which carry video 1 and video 2 signals, respectively. Input leads 1002 and 1004 may synchronize video 1 and video 2 at input timing blocks 1006 and 1008, respectively. Multiplexers 1010 may combine video 1 and video 1 for video formatting by video formatters 1012. Video formatters 1012 feed formatted video to sample rate converters 1014. Sample rate converters 1014 may output analog video to sub-carrier modulators 1018. Sub-carrier modulators 1018 may output modulated video to output multiplexer 1020. Output multiplexer 1020 may provide analog video signals to device interfaces as shown in FIG. 2.

VEC 1000 may include sample rate converter 1022 for signals that may not require sub-carrier modulation. Sample rate converter 1022 provides output directly to output multiplexer 1020. VEC 1000 may include multiplexer 1024, digital video formatter 1026 and DVI transmitter 1028 for providing a digital output corresponding to the analog output from output multiplexer 1020.

Figure 11:
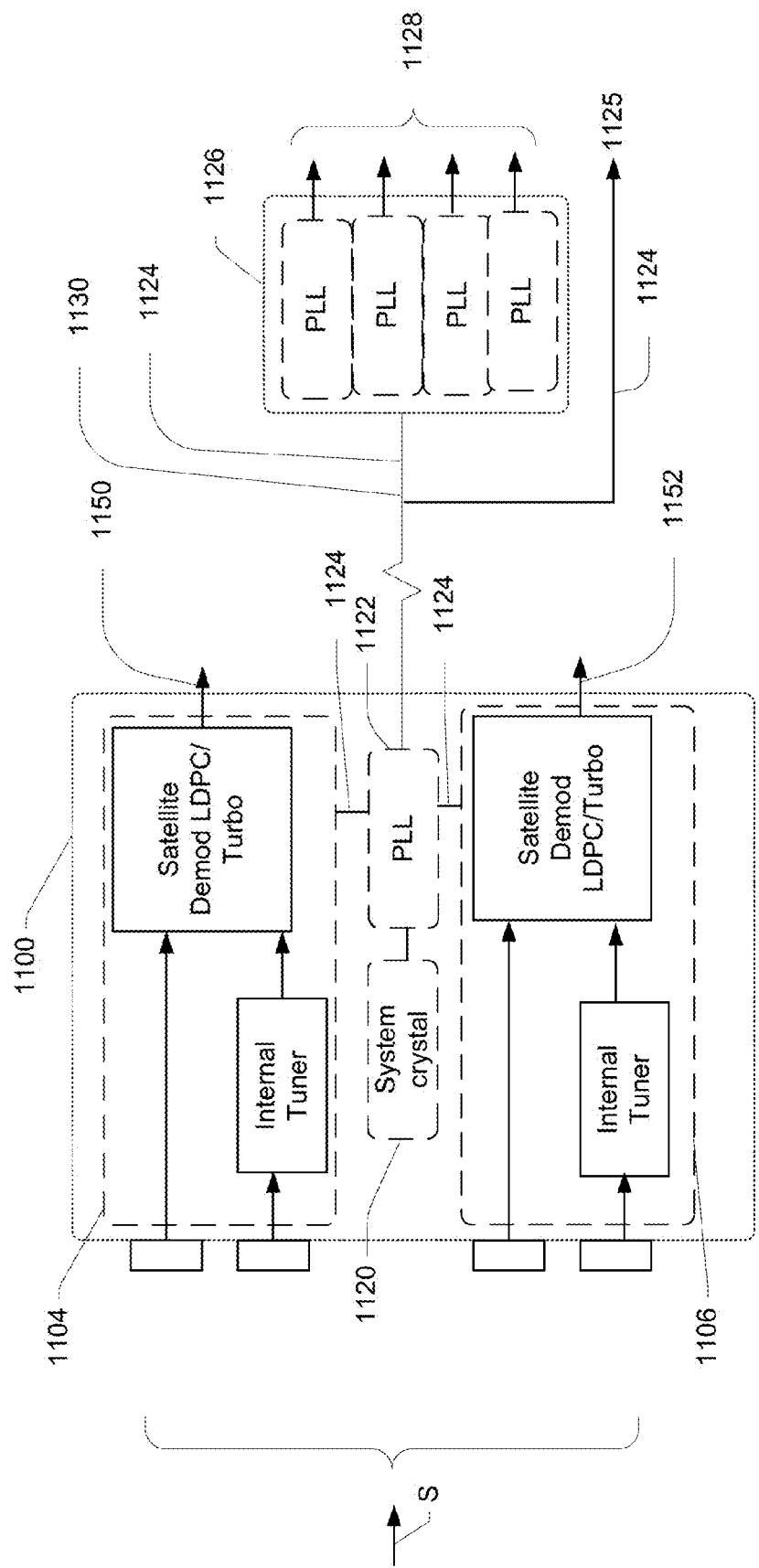
FIG. 11 shows a schematic diagram of another apparatus in accordance with the principles of the invention.

FIG. 11 shows illustrative satellite modem 1100. Satellite modem 110 may be present on a chip such as chip 200 (shown in FIG. 2) and may correspond to a satellite modem such as satellite modem 202. Satellite modem 1100 may include tuner channels 1104 and 1106, which may correspond to tuners 204 and 206 of satellite modem 202. Satellite tuner channels 1104 and 1106 may include outputs 1150 and 1152, respectively, for passing demodulated signals to a data transport processor such as 220 (shown in FIG. 2).

Satellite modem 1100 may include system oscillator 1120 for generating a primary timing frequency for tuner channels 1104 and 1106 and for any other processes that are executed in the same chip. PLL 1122 may receive the primary timing frequency and boost it to primary timing signal 1124. PLL 1122 may provide primary timing signal 1124 to tuner channels 1104 and 1106. PLL 1122 may provide primary timing signal 1124 to other processes on the chip at tap 1125. PLL 1122 may provide primary timing signal 1124 to PLL cluster 1126, which may generate higher frequencies with serial PLLs. The higher frequencies may be tapped at taps 128 for use in other processes on the chip. Because primary timing signal 1124 must be distributed to the other processes, it must be transmitted across the chip via conductor 1130. The signal-to-noise ratio of primary timing signal 1124 is greatest near system oscillator 1120 and least far away from system oscillator 1120. Tuner channels 1104 and 1106 may be sensitive to the signal-to-noise ratio of primary timing signal 1124. In embodiments of the invention in which system oscillator 1120 is embedded in satellite modem 1102, the noise affecting tuner channels 1104 and 1106 may be reduced. Accordingly, in a preferred embodiment of the invention system oscillator micrometers of tuner channels 1104 and 1106 in order to obtain the benefits of the invention. In addition, system oscillator may preferably be located equidistant from each tuner channel, and most preferably between the two tuner channels 1104 and 1106.

Aspects of the invention have been described in terms of illustrative embodiments thereof. A person having ordinary skill in the art will appreciate that numerous additional embodiments, modifications, and variations may exist that remain within the scope and spirit of the appended claims. For example, one of ordinary skill in the art will appreciate that the steps illustrated in the figures may be performed in other than the recited order and that one or more steps illustrated may be optional. The methods and systems of the above-referenced embodiments may also include other additional elements, steps, computer-executable instructions, or computer-readable data structures. In this regard, other embodiments are disclosed herein as well that can be partially or wholly implemented on a computer-readable medium, for example, by storing computer-executable instructions or modules or by utilizing computer-readable data structures.

Thus, devices and methods for receiving, processing and formatting digital video data have been described. Persons skilled in the art will appreciate that the present invention can be practiced using embodiments of the invention other than those described, which are presented for purposes of illustration rather than of limitation. The present invention is limited only by the claims that follow.

What is claimed is:

1. A semiconductor chip comprising:
a radio frequency signal tuner module integrated on the chip, the radio frequency signal tuner module comprising a direct conversion tuner having a wide dynamic range; and
a display interface module configured to receive programming information from the radio frequency signal tuner module and to communicate the programming information to a digital video recorder integrated on the chip.

2. The semiconductor chip of claim 1 wherein the direct conversion tuner is configured to convert a plurality of band inputs in the 250 MHz-2150 MHz range.

3. The semiconductor chip of claim 1 further comprising:
a first radio frequency input channel; and
a second radio frequency input channel.

4. The semiconductor chip of claim 3 wherein each of the first and second radio frequency input channels comprises:
an integrated tuner;
a demodulator;
a decoder stage; and
a multiplexer.

5. The semiconductor chip of claim 4 wherein the decoder stage comprises:
a turbo mode codec;
an LDPC/BCH codec; and
a DTV/DVB codec.

6. The semiconductor chip of claim 1 further comprising a data transport module comprising:
a data transport module input port in communication with the tuner module to receive a data transport stream representing the programming information;
a demultiplexing circuit for demultiplexing the data transport stream; and
a data transport module output port in communication with the display interface module to communicate a data stream representing the programming information to the display interface module.

7. The semiconductor chip of claim 6 wherein the data transport module further comprises a remultiplexing circuit that is configured to multiplex a data stream into a data transport stream.

8. The semiconductor chip of claim 1 further comprising:
a data transport module configured to receive a data transport stream representing the programming information, the data transport module comprising:
a demultiplexing circuit for demultiplexing the data transport stream; and
a data transport module output port in communication with a video decoder having a video decoder input port; wherein the video decoder is configured to decode a data stream received from the data transport module output port.

9. The chip of claim 8 wherein the video decoder comprises:
a first circuit configured to decode an AVC data stream;
a second circuit configured to decode a VC-1 data stream;
a third circuit configured to decode an MPEG2 data stream; and
a fourth circuit configured to decode an MPEG4 data stream.

10. The semiconductor chip of claim 8 further comprising a video and graphics module, the video and graphics module comprising:
a video and graphics module input port in communication with the video decoder;
a circuit configured to add text data to graphic data based on a selected input format and a selected output format; and
a video and graphics module output port for outputting a digital signal comprising the text data and the graphic data.

11. The semiconductor chip of claim 8 further comprising an analog video decoder, the video decoder comprising:
an analog video decoder input port;
a modulator; and
an analog video decoder output port;
wherein:
the analog video decoder input port is in communication with the video and graphics module and is configured to receive the digital signal and propagate the digital signal to the modulator; and
the modulator is configured to generate an analog signal based on the digital signal and provide the analog signal to the analog video decoder output port.

12. The semiconductor chip of claim 8 further comprising an analog output suite, the suite comprising an analog output for each of the following output formats:
video;
component;
S-Video;
Composite;
HDMI;
Channel 3/4; and
656.

13. The chip of claim 1 wherein the radio frequency signal tuner module comprises a phase-locked loop circuit configured to generate a clock signal and transmit the signal to the display interface module.

14. A system for receiving radio frequency signals and outputting digital data for communication, the system comprising:
a data transport module that is formed on a semiconductor substrate;
a personal video recorder interface that is formed on the semiconductor substrate;
a buffer for buffering data flow between the transport module and the personal video recorder interface, the buffer being formed on the semiconductor substrate; and
a security module that is formed on the substrate, is in communication with the buffer and is configured to perform a security operation on data for storage in the buffer.

15. The system of claim 14 further comprising a memory module output port that is imprinted on the substrate and is configured to communicate with a hard disc drive input port.

16. The system of claim 14 wherein the data transport module is imprinted on the semiconductor substrate.

17. The system of claim 14 wherein the personal video recorder interface is imprinted on the semiconductor substrate.

18. The system of claim 14 wherein the buffer comprises a circular memory module.

19. The system of claim 14 wherein the buffer is imprinted on the semiconductor substrate.

20. The system of claim 14 wherein the security module comprises a mem-to-mem security module.

* * * * *